United States Patent
Adams et al.

(10) Patent No.: US 6,697,262 B2
(45) Date of Patent: Feb. 24, 2004

(54) ELECTROMECHANICAL DEVICE FOR MOUNTING AN ELECTRONIC ASSEMBLY ON A MOUNTING RACK, IN PARTICULAR FOR MOUNTING A DISPLAY INSTRUMENT RECESSED IN A DASHBOARD

(75) Inventors: Jürgen Adams, Villingen-Schwenningen (DE); Jürgen Wolf, Villingen-Schwenningen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 10/102,617

(22) Filed: Mar. 19, 2002

(65) Prior Publication Data

US 2002/0172015 A1 Nov. 21, 2002

(30) Foreign Application Priority Data

Mar. 30, 2001  (DE) ......................................... 101 16 008

(51) Int. Cl.[7] ................................................ H05K 9/00
(52) U.S. Cl. .................... 361/785; 361/785; 361/760; 361/730; 361/789; 439/391; 368/10
(58) Field of Search .................................. 361/816, 760, 361/788, 767, 748, 730, 785, 789; 439/371; 368/10

(56) References Cited

U.S. PATENT DOCUMENTS 4,846,382 A * 7/1989 Foultner et al. ............ 224/483

FOREIGN PATENT DOCUMENTS

JP       2000333709 A  * 12/2000  ........... A44B/18/00

* cited by examiner

*Primary Examiner*—David Martin
*Assistant Examiner*—Hung Bui
(74) *Attorney, Agent, or Firm*—Martin A. Farber

(57) ABSTRACT

An electromechanical device for mounting an electronic assembly on a mounting rack, in particular for mounting a display instrument recessed in a dashboard. There is at least one conductive Velcro-type connector between the electronic assembly (6) and the mounting rack (7), the conductive Velcro-type connector serving both for the mechanical fastening and the electrical contacting of the assembly (6) on the mounting rack (7).

8 Claims, 1 Drawing Sheet

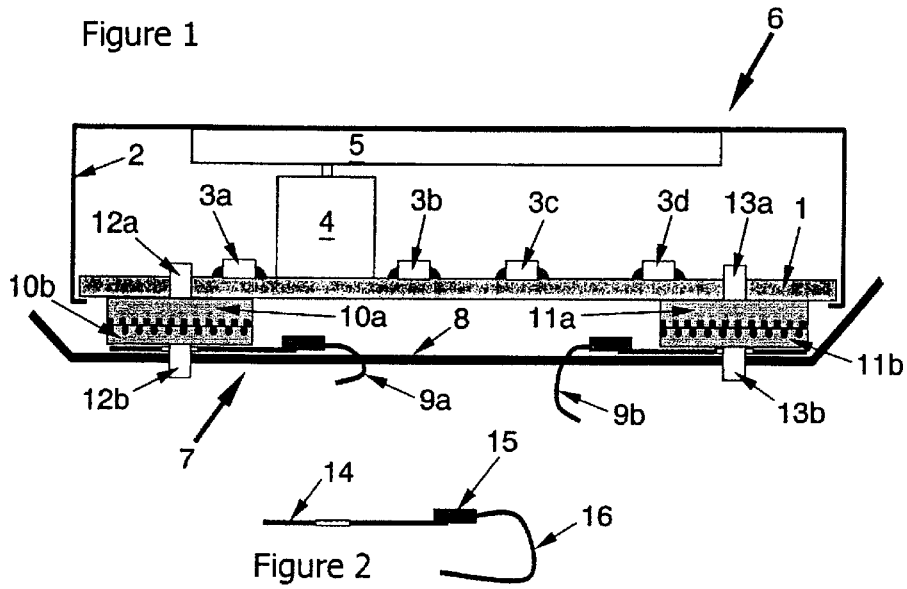
Figure 1
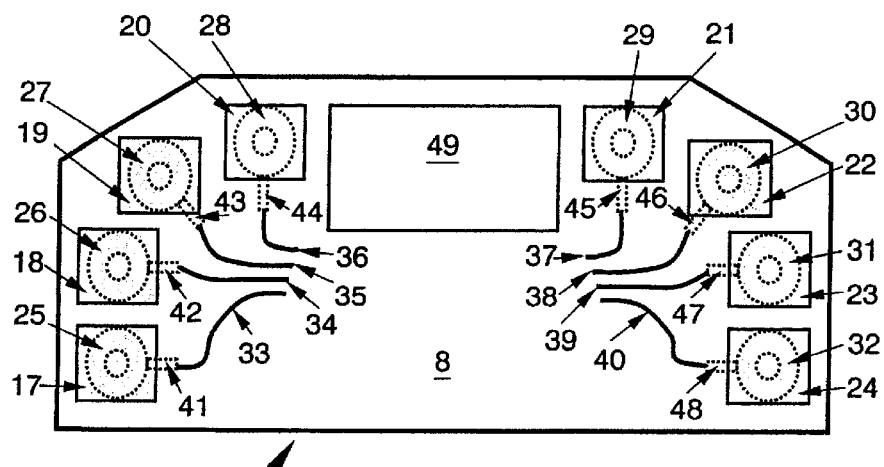
Figure 2
Figure 3

ELECTROMECHANICAL DEVICE FOR MOUNTING AN ELECTRONIC ASSEMBLY ON A MOUNTING RACK, IN PARTICULAR FOR MOUNTING A DISPLAY INSTRUMENT RECESSED IN A DASHBOARD

FIELD AND BACKGROUND OF THE INVENTION

According to the precharacterizing clause of the first claim, the invention relates to an electromechanical device for mounting an electronic assembly on a mounting rack, in particular for mounting a display instrument recessed in a dashboard.

It is common practice to bolt or clip an electronic assembly on a mounting rack to fasten it mechanically. In the preferred application, the electrical connection between the electronic assembly and the terminals on the mounting rack is often established by plug systems. When mounting a display instrument recessed in a dashboard, however, aggravating circumstances additionally arise. In the case of a dashboard fitted in a vehicle, the space is usually very confined and accessibility to the mounting location may sometimes be extremely difficult, depending on the position in which the display instrument is fitted. The electrical connection between the display instrument and the dashboard often has to be performed before it is mechanically fastened, for which reason mounting aids which provisionally fix the display instrument are used, so that the electrical connection can be established by bringing the plug systems into engagement. The position in which the display instrument is fitted in the dashboard is sometimes so unfavorable for performing these activities that a fitter cannot work in his viewing area but is obliged to act blindly, which of course makes errors more likely. In addition, an adjustment of the assembly on the mounting rack is often necessary. For this purpose, the mechanical connecting elements are usually formed with ranges of tolerance. The position in which a display instrument is fitted in the dashboard may be obtained, for example, by means of an oversized hole, screw fittings are formed with elongate holes, clip connections are provided with lateral clearances. In this way, the display instrument is set up and fixed at the place it is to be fitted. Mounting gaps are generally covered with a panel or a front frame.

SUMMARY OF THE INVENTION

It is now the object of the present invention to make the mounting of an electronic assembly on a mounting rack easier to perform, in particular the mounting of a display instrument recessed in a dashboard, taking into account the usually unfavorable fitting conditions, in particular in a vehicle, and at the same time to make it more reliable by eliminating potential sources of error.

The object is achieved by an electromechanical device wherein the electromechanical device comprises at least one conductive VELCRO-type connector between the electronic assembly and the mounting rack, which serves both for the mechanical fastening and the electrical contacting of the assembly on the mounting rack.

Further refinements of the solution found are, for instance, that the VELCRO-type connector may consist either of a metallic material, of a conductive plastic or one with a conductively coated plastic. Combinations of the forms mentioned are also possible. A VELCRO-type connector according to the invention may also be designed in such a way that it comprises a plastic support in which a metal mesh is incorporated by encapsulation, the plastic support then substantially providing the required elastic forces and the metal mesh allowing the mechanical and electrical connection. In the case of a generally two-part VELCRO-type connector pairing, it is also possible for one part of the conductive VELCRO-type connector to consist of plastic, whereas a metallic grid is provided for the opposite side of this VELCRO-type-connector catching fastener pairing. Depending on requirements, a plurality of conductive VELCRO-type connectors may be provided, with the effect of producing as it were a number of islands or different segments for the mechanical fastening and electrical contacting, each themselves forming a contact location. This measure also increases the bonding surface area required for reliable mechanical fixing, the size of which depends on the weight, the dynamic loading and the fitting position of the assembly. Segmenting of the conductive VELCRO-type connector also allows a number of discrete electrical contacts to be realized for different signal paths and electric potentials. Forming a contact location with a surface area which is as large as possible has a favorable effect on its transition resistance and contact stability.

BRIEF DESCRIPTION OF THE DRAWINGS

The invention is to be explained in somewhat more detail on the basis of 3 figures, making its special advantages become clear. Thus, taking the example of mounting a display instrument designed as instrument cluster in a dashboard, FIG. 1 shows a simplified longitudinal sectional representation of an instrument cluster to be mounted according to the invention, FIG. 2 shows an example of contacting on the mounting rack and FIG. 3 shows a simplified representation of a base plate of a mounting rack which is located in the dashboard and on which the mounting of the instrument cluster in a dashboard takes place.

DETAILED DESCRIPTION OF THE PREFERRED EMBODIMENT

Represented in a greatly simplified form in FIG. 1 is an instrument cluster which comprises a printed circuit board 1 and a housing 2 enclosing the printed circuit board 1. Loaded on the printed circuit board 1 are various electronic components 3a, 3b, 3c, 3d, but also usually at least one electromechanical assembly 4, such as for example a drive for an analog display unit 5, only indicated here. The instrument cluster as a whole forms the electronic assembly 6 according to the claim, which is to be mounted on a mounting rack 7, the mounting rack 7 being part of a dashboard in the preferred application, or else it may be the chassis of the vehicle. The mounting rack 7 may consequently have more or less any desired geometry, so long as it has a region which is suitable as a mounting location for the electronic assembly 6. This mounting location is referred to hereafter as a base plate 8 of the mounting rack 7. Generally, at least the base plate 8 of the mounting rack 7 as such consists of an electrically nonconductive material or it has an electrically nonconductive surface, at least at the locations at which the electromechanical device according to the invention is to be attached.

According to the invention, both the mechanical fastening of the electronic assembly 6 on the base plate 8 of the mounting rack 7 and the electrical connection between the electronic assembly 6 and the electrical terminals 9a, 9b, which are provided on the mounting rack 7 and from there establish an electrical connection to various devices in a vehicle, take place by an electromechanical device, which in this example shown comprises the two conductive VELCRO-type connector pairings 10a, 10b and 11, 11b, which are in each case of a two-part configuration and are arranged between the electronic assembly 6 and the mounting rack 7. In this arrangement, an upper part 10a, 11a of each VELCRO-type connector pairing is attached to the printed circuit board 1 by means of a conductive stud 12a, 13a, whereas a lower part 10b, 11b of the VELCRO-type connector pairing is attached on the base plate 7 of the mounting rack 6 by means of a not necessarily conductive stud 12b, 13b. All the studs 12a, 12b, 13a, 13b protrude from the lower part 10b, 11b and from the upper part 10a, 11a of each VELCRO-type connector pairing respectively on the rear of the VELCRO-like area. The studs 12a, 13a attached in this way on the upper part 10a, 11a of the VELCRO-type connector pairing enter plated-through holes of the printed circuit board 1 or pass through the printed circuit board 1. The way in which they are introduced into the printed circuit board 1 in a nonpositively locking manner allows the studs 12a, 13a also at the same time to form an electrical contact between the upper part 10a, 11a of each VELCRO-type connector pairing and the conductor tracks of the printed circuit board 1, which are not represented here. The studs 12b, 13b on the lower part 10b, 11b of the VELCRO-type connector pairing, which are likewise introduced into holes of the base plate 8 of the mounting rack 7 in a nonpositively locking manner, merely have the task of mechanically fastening this part 10b, 11b of the VELCRO-type connector pairing on the base plate 8 of the mounting rack 7, so that other connecting techniques, such as screwing or riveting for example, may also be appropriate for this fastening. However, for technical production-related reasons, it is recommendable for both parts 10a, 10b, 11a, 11b of the VELCRO-type connector pairing to be configured in the same way, because this has the effect that the number of component variants is not unnecessarily increased. In FIG. 1, the studs 12a, 12b, 13a and 13b are respectively arranged centrally in each VELCRO-type connector pairing. This arrangement is not absolutely necessary, since a number of studs may also be provided for each VELCRO-like area, which improves its mechanical strength and its electrical contact stability.

A thin, flat-formed, electrically conductive underlay is preferably provided between the lower part 10b, 11b of the VELCRO-type connector pairing and the base plate 8 of the mounting rack 7 for the electrical contacting of this part 10b, 11b of the VELCRO-type connector pairing, which at this location may be merely clamped or adhesively bonded for its fixing. As FIG. 2 shows in the representation of a single part, this contacting on the mounting rack comprises, for example, a contact ring or a flat metallic perforated underlay plate 14. Attached to the contact ring or the underlay plate 14 there is, for example, a crimping shoe 15 for an electrical cable 16 for the vehicle, which leads to various electrical devices in the vehicle. For good electrical contact stability, the conductive underlay should, by analogy with what was said in connection with the upper part 10a, 11a of the Velcro-type connector pairing, similarly be formed with a surface area which is as large as possible for the electrical contacting of the lower part 10b, 11b of the VELCRO-type connector pairing.

FIG. 3 represents in a simplified form, in a plan view facing the instrument cluster to be mounted, a base plate 8 of a mounting rack 7 which is located in the dashboard and on which the mounting of the instrument cluster in the dashboard is performed. Shown here are a plurality of lower parts 17 to 24 of the VELCRO-type connector pairing, which are fastened on the base plate 8 and are respectively underlaid by a metallic underlay plate 25 to 32 for the contacting on the mounting rack. Attached to the underlay plates 25 to 32 are contact shoes 41 to 48 securing electric lines 33 to 40, the electric lines 33 to 40 leading to various electrical devices in the vehicle. Furthermore, FIG. 3 shows on the base plate 8 a (VELCRO-like area 49 of a lower part of a VELCRO-type connector pairing that is larger in comparison with the lower parts 17 to 24 of the conductive Velcro-type connector pairing, and is not of a conductive form, but is merely provided optionally, to increase the bonding area between the assembly 6 to be mounted and the mounting rack 7. It goes without saying that a counterpart to this VELCRO-like area 49 comprising a VELCRO-like connector is provided at a corresponding location on the assembly 6.

In the case of the solution presented here, a VELCRO-type connector known per se is further developed to form an electromechanical device, in order to perform both mechanical fastening and electrical contacting at the same time. In the case of a VELCRO-type connector, as known, a high number of flexibly formed shaped elements, such as studs, hooks, eyes or pins, engage in one another in such a way that the shaped elements enter into partial interlocking engagements by elastic deformation and gripping from behind. The sum of the individual interlocking engagements then produces the necessary holding and shearing forces for the mechanical fixing. For the preferred application presented here of the proposed solution, it is important that, if the fitting of a display instrument in a dashboard in a vehicle is performed with these means of providing a solution, adequately high shearing forces can be absorbed by the interlocking engagements in order that such mounting also complies with the relevant accident regulations. This requirement can be met by a suitable geometry of the shaped elements and by their number. Otherwise, the dynamic loads in a vehicle would give rise to the risk of inadequate 35 locational stability of an assembly mounted in such a way on a mounting rack.

The mechanical fastening of a display instrument with a conductive VELCRO-type connector has the advantage that virtually any desired positioning and lateral alignment of the electronic assembly on the mounting rack or of the display instrument in a dashboard is possible.

Since, as a result of the increasing use of data bus systems in the vehicle, modern instrument clusters now only require relatively few contact elements for their electrical supply and for data transmission, implementing the proposed solution is very advantageous, because it significantly reduces the effort for mounting an electronic assembly on a mounting rack, in particular the mounting of a display instrument in a dashboard. During mounting, the VELCRO-type connector pairings are brought into congruence with one another, within a certain tolerance range, on the base plate 8 of the mounting rack 7. For the adjustment of the assembly, it is possible as in the past either to use a system of simple the receptacle in the dashboard to guide the assembly to its final position on the mounting rack by means of guiding ribs or other similar means. The assembly is then finally clipped in place by specifically directed pressure being applied by means of the shaped elements of the VELCRO-type connectors, whereby, according to the invention, the electrical connection between the assembly and the terminals on the mounting rack is then also established at the same time.

Since, as a result of the increasing use of data bus systems in the vehicle, modern instrument clusters now only require relatively few contact elements for their electrical supply and for data transmission, implementing the proposed solution is very advantageous, because it significantly reduces the effort for mounting an electronic assembly on a mounting rack, in particular the mounting of a display instrument in a dashboard. During mounting, the Velcro-type connector pairings are brought into congruence with one another, within a certain tolerance range, on the base plate 8 of the mounting rack 7. For the adjustment of the assembly, it is possible as in the past either to use a system of simple voids or for the receptacle in the dashboard to guide the assembly to its final position on the mounting rack by means of guiding ribs or other similar means. The assembly is then finally clipped in place by specifically directed pressure being applied by means of the shaped elements of the Velcro-type connectors, whereby, according to the invention, the electrical connection between the assembly and the terminals on the mounting rack is then also established at the same time.

We claim:

1. An electromechanical device for mounting an electronic assembly on a mounting rack, in particular for mounting a display instrument recessed in a dashboard, comprising at least one conductive catching fastener between the electronic assembly (6) and the mounting rack (7), same said connector serving both for mechanical fastening and electrical contacting of the assembly (6) on the mounting rack (7), wherein there is a catching fastener pairing having an upper part (10*a*, 11*a*) attached to a printed circuit board (1) of the electronic assembly (6) by a conductive stud (12*a*, 13*a*), wherein a lower part (10*b*, 11*b*) of the catching fastener pairing is attached on a base plate (8) of the mounting rack (7) by a not necessarily conductive stud (12*b*, 13*b*), all the studs (12*a*, 12*b*, 13*a* and 13*b*) protruding from the lower part (10*b*, 11*b*) and from the upper part (10*a*, 11*a*) of each catching fastener pairing respectively on a rear of a catching fastener-like area.

2. The electromechanical device as claimed in claim 1, wherein the studs (12*a*, 13*a*) attached on the upper part (10*a*, 11*a*) of the catching fastener pairing enter plated-through holes of the printed circuit board (1) or pass through the printed circuit board (1).

3. The electromechanical device as claimed in claim 2, wherein the studs (12*a*, 13*a*) attached on the upper part (10*a*, 11*a*) of the catching fastener pairing are introduced into the printed circuit board (1) in a nonpositively locking manner and simultaneously form an electrical contact between the upper part (10*a*, 11*a*) of each catching fastener pairing and the printed circuit board (1).

4. The electromechanical device as claimed in claim 1, wherein a plurality of studs are provided for each said catching fastener-like area.

5. The electromechanical device as claimed in claim 1, wherein an electrically conductive underlay is provided between the lower part (10*b*, 11*b*) of the catching fastener pairing and the mounting rack (7) for electrical contacting of said lower part (10*b*, 11*b*) of the catching fastener pairing.

6. The electromechanical device as claimed in claim 5, wherein the electrically conductive underlay has a thin and flat form.

7. The electromechanical device as claimed in claim 5, wherein the electrically conductive underlay is clamped or adhesively bonded.

8. The electromechanical device as claimed in claim 5, wherein the electrically conductive underlay comprises a contact ring or a flat metallic perforated underlay plate (14).

* * * * *